United States Patent [19]

Saito

[11] Patent Number: 4,936,784

[45] Date of Patent: Jun. 26, 1990

[54] ELECTRONIC COMPONENT SOCKET

[75] Inventor: Jun Saito, Tokyo, Japan

[73] Assignee: Hirose Electric Co., Ltd., Tokyo, Japan

[21] Appl. No.: 357,130

[22] Filed: May 26, 1989

[30] Foreign Application Priority Data

Jul. 18, 1988 [JP] Japan ................................. 63-178500

[51] Int. Cl.⁵ ............................................ H01R 23/72
[52] U.S. Cl. ........................................ 439/72; 439/71; 439/331
[58] Field of Search ................................. 439/68–73, 439/66, 330, 331, 525, 526

[56] References Cited

U.S. PATENT DOCUMENTS

| 3,904,262 | 9/1975 | Cutchaw | 439/331 |
| 4,176,895 | 12/1979 | Aldridge | 439/912 |
| 4,204,722 | 5/1980 | Yasui | 439/331 |
| 4,560,218 | 12/1985 | Billman et al. | 439/70 |
| 4,728,297 | 3/1988 | Cohen | 439/72 |
| 4,843,313 | 6/1989 | Walton | 439/66 |

FOREIGN PATENT DOCUMENTS 63-013666  4/1988  Japan .

Primary Examiner—Neil Abrams
Attorney, Agent, or Firm—Kanesaka & Takeuchi

[57] ABSTRACT

An electronic component socket for connecting to an electrical circuit on a printed circuit board an electronic component having a package and rows of leads arranged along sides of said package, which includes an insulating socket body; contact elements arranged in the socket body; and a movable retainer having a retaining member on the underside for pressing each lead of the electronic component onto a corresponding contact portion of the contact element against a vertical spring force of the contact element.

7 Claims, 4 Drawing Sheets

ELECTRONIC COMPONENT SOCKET

BACKGROUND OF THE INVENTION

The present invention relates to electronic component sockets for mounting and connecting a packaged electronic component, such as an IC, LSI, or hybrid electronic circuit, on a printed circuit board.

Japanese U.M. Patent Application Kokai No. 63-13666 discloses an electronic component socket of such a type as described above. The connection structure of this socket includes a connector frame with a plurality of channels provided on each side. A plurality of leads of an electronic component are placed in the channels for connection to conductors of the connector, which are connected to the pads on a printed circuit board. A retainer member has a plurality of legs inserted into apertures of a printed circuit board to press the leads of the electronic component against the conductors via special spring members.

The above electronic component socket, however, has the following disadvantages.

(1) The retainer member made to enclose the entire connector increases the entire socket size and height thus failing to meet a demand for a compact, low-profile socket.

(2) The apertures provided on a printed circuit board for receiving the legs of the socket limit the design of a wiring pattern on the PCB, resulting in the reduced mounting density.

(3) The special spring members placed between the retainer member and the leads increase the number of components, resulting in the higher unit manufacturing cost.

(4) The retainer member and the spring members press the leads of an electronic component against the surfaces of conductors only in a vertical direction thus causing no cleaning effect between the leads and the conductors. As a result, when an oxide film or dirt is accumulated on the conductors while the socket is not used, the increased contact resistance can cause poor contact between the leads and the conductors.

SUMMARY OF THE INVENTION

Accordingly, it is an object of the present invention to provide an electronic component socket which is free of the above problem.

According to the invention there is provided an electronic component socket for connecting to an electrical circuit on a printed circuit board an electronic component having a package and at least one pair of rows of leads arranged along at least one pair of sides of said package, which includes a socket body; a plurality of contact elements arranged in the socket body; a movable retainer; the socket body having a floor portion on which the electronic component is to be mounted and at least one pair of side walls extending along the leads; a plurality of contact channels provided on the floor portion at an arranging pitch equal to that of the leads; the contact element being made from conductive, resilient sheet metal and having a generally S-shaped form so as to give a spring property in a vertical direction; the contact element having at an upper end a contact portion for contact with a corresponding lead of the electronic component and a connection portion to be connected to a corresponding conductor of the electrical circuit; the contact element being disposed in a corresponding contact channel on the floor portion such that the contact portion is exposed from an upper surface of the floor portion adjacent the side wall and the connection portion is positioned on a lower surface of the floor portion; a retaining member provided on the movable retainer for pressing each lead of the electronic component onto a corresponding contact portion of the contact element against a vertical spring force of the contact element; a first engaging member provided on an inside of the side wall; and a second engaging member provided on an outside of the movable retainer at a position corresponding to the first engaging member for engagement with the first engaging member by sliding the movable retainer to one side so that the retaining member is slid sideways on the leads, whereby the movable retainer is latched to the socket body.

Other objects, features, and advantages of the invention will be apparent from the following description when taken in conjunction with the accompanying drawings.

DESCRIPTION OF THE PREFERRRED EMBODIMENT

Figure 1:
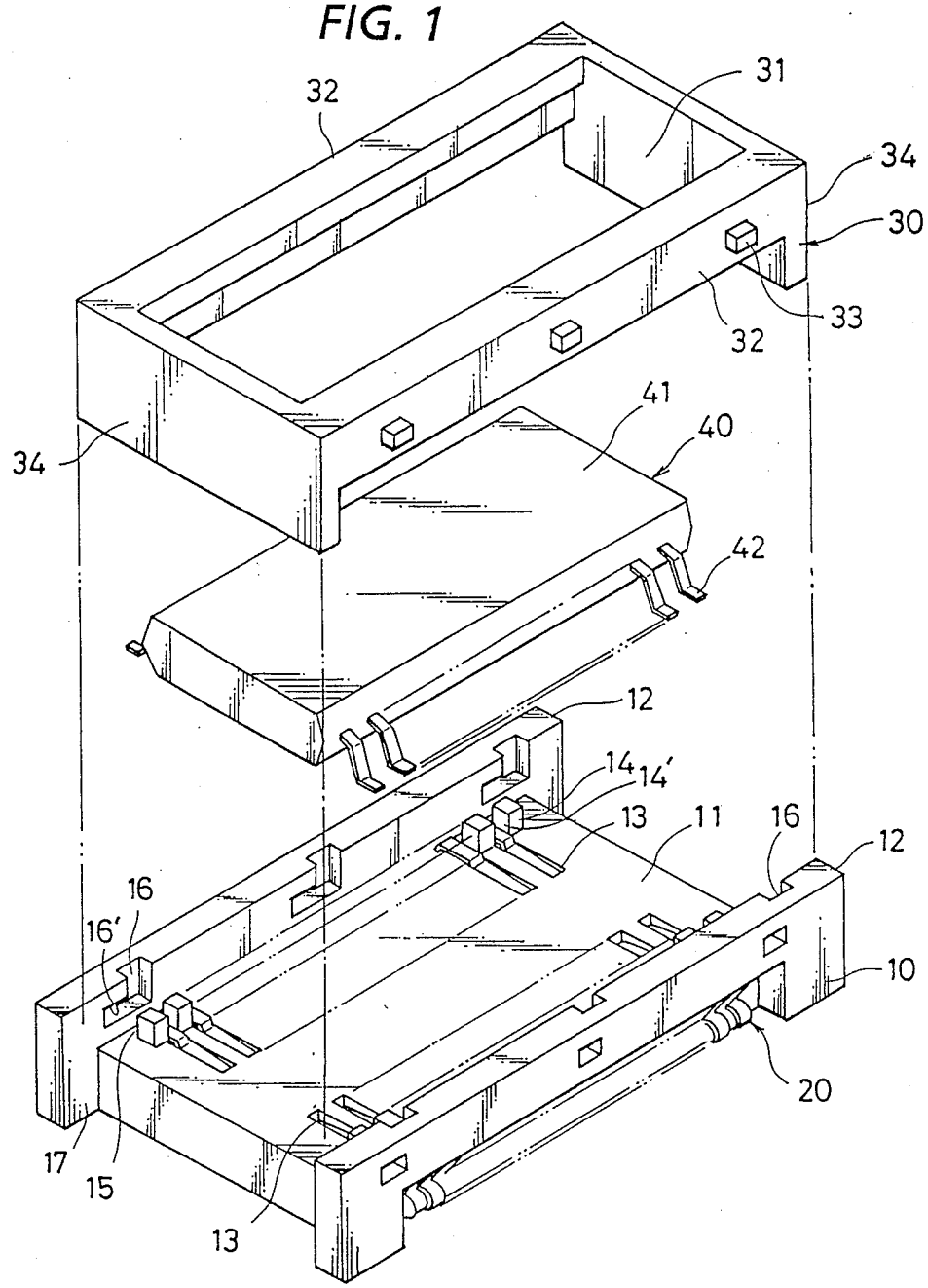
FIG. 1 is an exploded, perspective view of an electronic component socket according to an embodiment of the present invention.

In FIG. 1, the electronic component socket includes a socket body 10 made of an insulating material, such as a plastic, a plurality of contact elements 20, and a movable retainer 30. An electronic component 40 to be mounted in the socket includes a package 41 housing an IC or the like and a plurality of leads 42 arranged along opposite sides of the package 41.

The socket body 10 has a flat floor 11 and a pair of side walls 12. A pair of rows of contact channels 13 are provided on the flat floor 11 arranged along the side walls 12. A plurality of guiding posts 14 are provided on opposite sides of each contact channel 13 forming a guiding groove 14' for guiding the insertion of a lead 42 of the electronic component 40. The width and the arranging pitch of these guiding channels 14' are set slightly greater than and equal to those of the leads 42 respectively. Each row of guiding posts 14 is spaced from the adjacent side wall 12 forming an elongated recess 15 for receiving the retaining side 32 of the movable retainer 30. A pair of L-shaped latch notches 16 are provided on each side wall 12 for receiving latch studs 33. The flat floor 11 is made shorter than the side walls 12 forming a pair of recesses 17 for receiving vertical walls 34 of the movable retainer 30.

Figure 2:
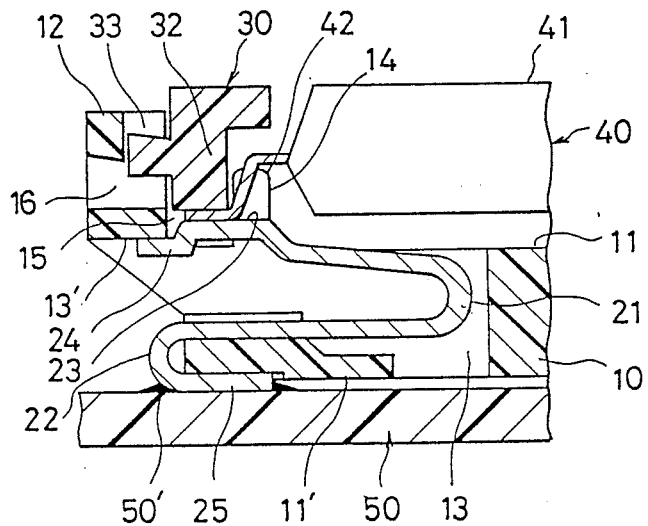
FIGS. 2 and 3 are sectional views of part of the electronic component socket of FIG. 1.

As shown in FIG. 2, each contact element 20 is made by stamping and forming flexible, conductive sheet metal so as to have first and second U-shaped sections 21 and 22, respectively, giving flexibility in the vertical direction. The upper leg of the first U-shaped section 21 has a contact portion 23 for contact with the corresponding lead 42 of an electronic component 40 and, at its free end, an engaging tip 24 for limiting the upward movement of the contact portion 23. The engaging tip 24 abuts the top wall 13' of the contact channel 13 to limit the upward movement of the contact portion 23 of the first spring section 21. The lower leg of the second U-shaped section 22 has a connection end 25 extending inwardly along the bottom wall 11' and soldered at 50' to a circuit conductor (not shown) of a printed circuit board 50.

As shown in FIG. 1, the movable retainer 30 is made in the form of a generally rectangular frame with a central opening 31 for receiving an electronic component 40. A pair of retaining sides 32 are provided on opposite longer sides of the rectangular frame 30 for insertion into the elongated recesses 15. Three latch studs 33 are provided on the outside surface of each retaining side 32. The shorter sides of the rectangular frame 30 extend downwardly forming a pair of vertical walls 34.

The procedures for connecting to and removing from a PCB an electronic component by means of the above socket will be described.

(1) As shown in FIG. 2, the socket body 10 with the contact elements 50 is mounted on the PCB 50 such that the contact portions 25 are soldered at 50' to a conductive pattern (not shown) of the PCB.

(2) The electronic component 40 with the leads 42 projecting from both sides of the package 41 is then mounted on the flat floor 11 so that each lead 42 fits in the corresponding guiding groove 14' and rests on the contact portion 23 of the corresponding contact element 20.

(3) The retaining sides 32 of the movable retainer 30 are then fitted into the elongated recesses 15 of the socket body 10 for connection of the movable retainer 30 to the socket body 10 such that the latch studs 33 are placed in the latch notches 16.

Figure 3:
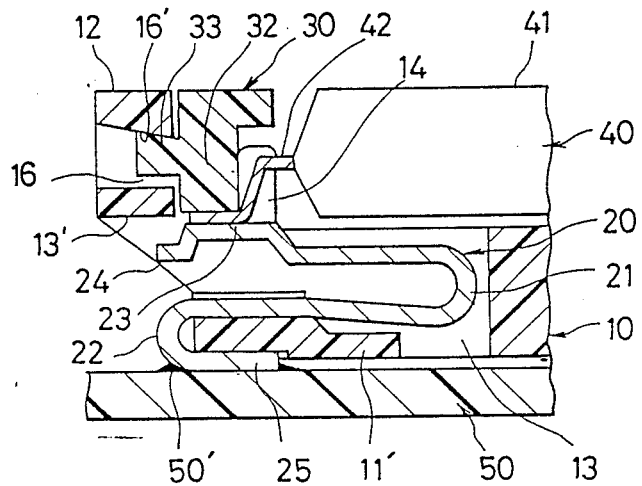

(4) As shown in FIG. 3, the movable retainer 30 is pressed further downwardly to lower the contact portion 23 of each contact element 20 against its spring force. The movable retainer 30 is then moved to the left in FIG. 1 such that the latch studs 33 engage the shoulders 16' of the latch notches 16 thus latching the movable retainer 30 to the socket body 10.

FIG. 3 shows this locking condition under which the contact portions 23 of the contact elements 30 are brought into good electrical contact with the leads 42 of the electronic component 40 because of their spring return force. In addition, this sliding movement of the movable retainer 30 makes the leads 42 slightly slide on the surfaces of the contact portions 23 thus providing a cleaning effect. That is, even if the lead 42 and/or the contact portion 23 has an oxide film or dirt thus increasing its contact resistance while it is not used, such cleaning effect removes the oxide film or dirt thereby ensuring a good electrical contact.

(5) In order to remove the electronic component 40 from the socket body 10, the movable retainer 30 is slid in a direction opposite to that of the paragraph (4) to release the latch studs 33 and then moved upwardly for removal. The electronic component 40 is now free for removal from the flat floor 11 of the socket body 10.

Figure 4:
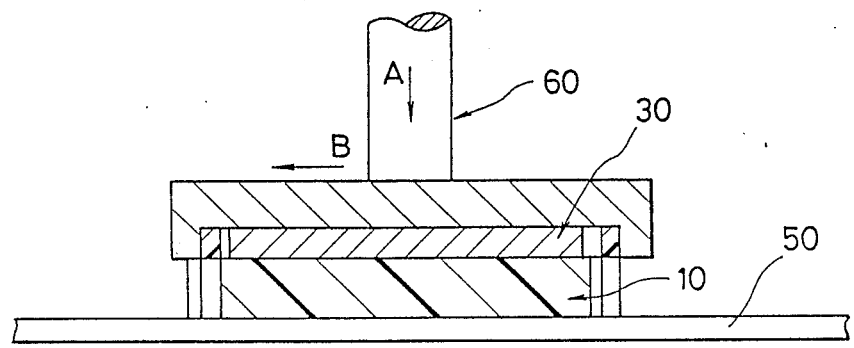
FIG. 4 is a sectional view of an electronic component socket showing how to remove the electronic component with the aid of a tool.

FIG. 4 shows how to mount and remove by a manual tool 60 a multipole electronic component whereof the number of contact elements arranged in the socket body 10 is too large to move by hand the movable retainer 30.

After the electronic component is placed on the socket body 10 which has been connected to the PCB 50, the movable retainer 30 is pressed downwardly in the direction A by the manual tool 60 and then slid in the direction B for mounting the electronic component. To remove the mounted electronic component, the movable retainer 30 is slid by means of the manual tool 60 in a direction opposite to the direction B and then lifted in a direction opposite to the direction A.

Figure 5:
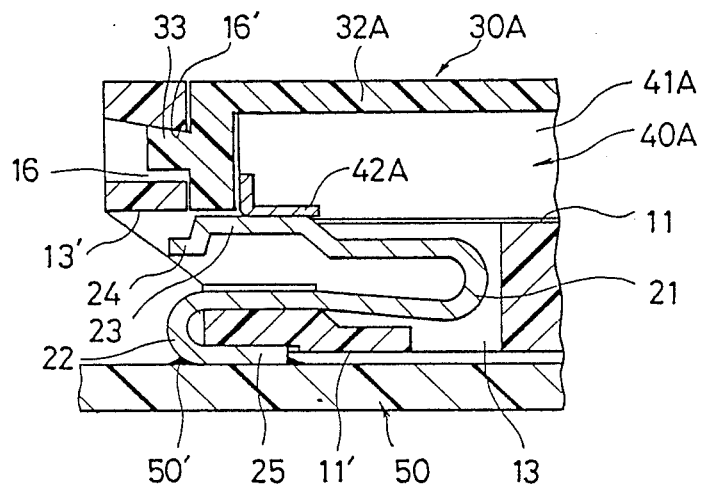
FIG. 5 is a sectional view of part of an electronic component socket according to another embodiment of the invention.

FIG. 5 shows an electronic component socket according to another embodiment of the invention. This embodiment is suited to connect a chip carrier type electronic component 40A with contact elements 42A arranged on the lower surface. The socket structure is the same as that of the above embodiment except that the retaining ceiling 32A of a movable retainer 30A presses the top surface of a package 41A of the electronic component 40A.

Figure 6:
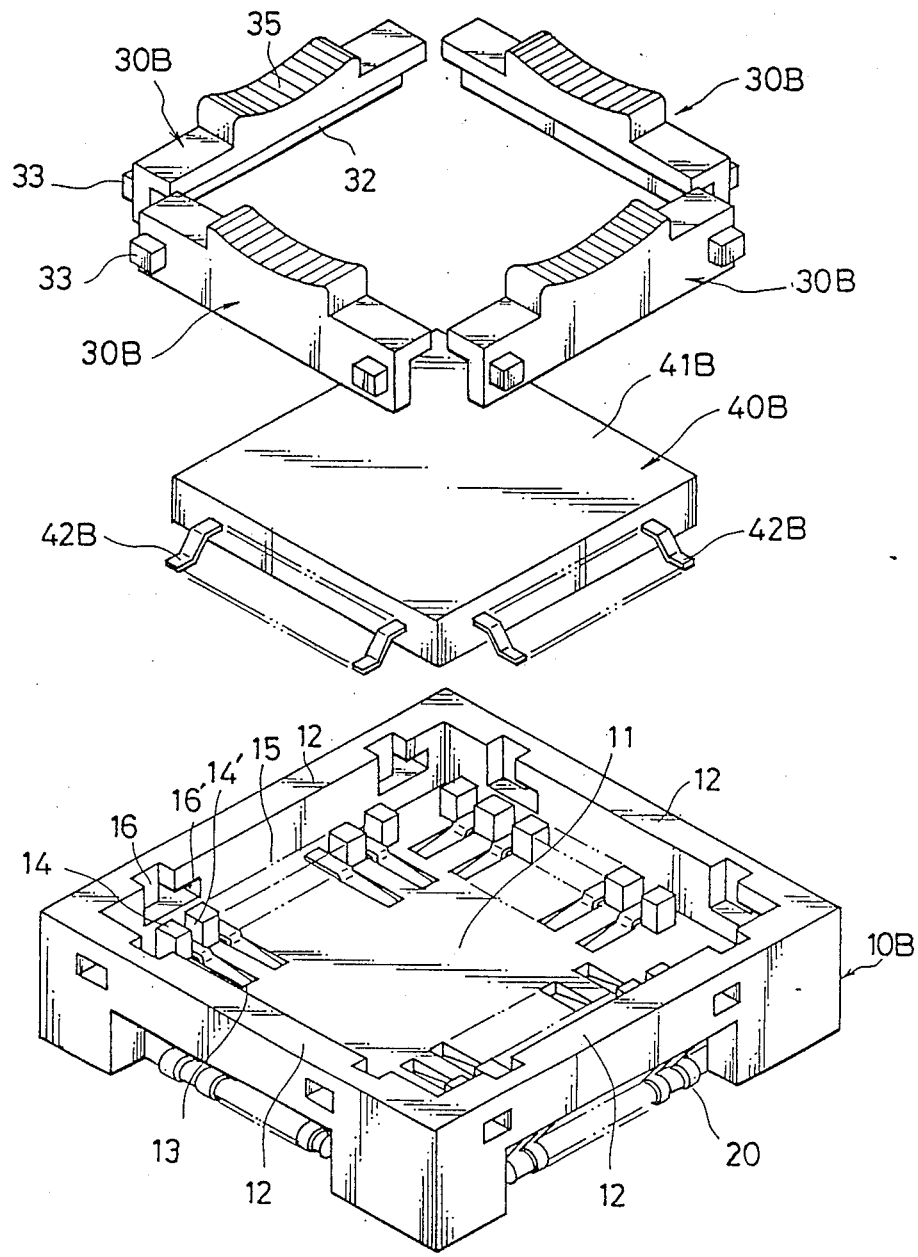
FIG. 6 is an exploded perspective view of an electronic component socket according to still another embodiment of the invention.

FIG. 6 shows an electronic component socket according to still another embodiment of the invention. This socket is suited to connect an electronic component 40B which has a package 41B housing an IC or the like and a plurality of leads 42B arranged along four sides of the package. The socket body 10B has four side walls 12 around a flat floor 11 on which a plurality of contact channels 13 are provided along each side wall 12. A pair of guiding posts 14 are provided on opposite sides of each contact channel 13 forming a guiding groove 14'. A row of the guiding posts 14 is spaced from each adjacent side wall 12 so as to form an elongated recess for receiving the retention wall 30B. A pair of latch notches 16 are provided on each side wall 12. A plurality of contact elements 20 as described above are arranged in the same way.

The movable retainer in this embodiment is made up of four movable retainer members 30B. Each movable retention member 30B has a retaining side 32 for fitting into the elongated recess 15 and a pair of latch studs 33 for engagement with the latch notches 16. It also has an operational knob 35 at its top. The members assigned the same reference numerals as those of FIGS. 1-3 have the same functions as those described above with reference to FIGS. 1-2.

In order to mount the electronic component 40B on this socket, the electronic component 40B is first mounted on the flat floor 11 of the socket body 10B so that respective leads 42B are placed in the corresponding guiding grooves 14' and rest on the contact portions of the corresponding contact elements 20 arranged along each side of the socket body 10. Under this condition, each movable retainer member 30B is fitted into the corresponding elongated recess 15 and slid sideways so that the latch studs 33 engage the corresponding latch notches 16.

To remove the connected electronic component 40B from the socket body 10B, each movable retainer member 30B is slid in the reverse direction and pulled upwardly.

The latch studs and the latch notches may be provided on the socket body and the movable retainer member respectively. The package of an electronic component may be slid slightly sideways by means of the movable retainer member to clean the contact surfaces of leads and contacts elements. Although, the sliding length of each lead in the above embodiments is limited by the guiding posts, stoppers may be provided on the sides of an electronic component package to limit the sliding length thereby limiting the sliding length of each lead.

The electronic component socket of the invention has the following advantages.

(1) The simple and compact movable retainer structure makes it possible to provide a compact connector thereby allowing higher mounting density in the unit. Especially, the height is reduced so that a low profile unit is possible.

(2) The movable retainer is slid sideways making the leads of an electronic component slightly slide on the contact elements thereby providing a cleaning effect thus reducing the contact resistance and the possibility of a poor electrical contact.

(3) Since the leads of an electronic component are brought into contact with the contact portions of contact elements by the strong spring force of the contact elements themselves, there is no need for additional spring members thus reducing the number of components and the unit manufacturing cost.

While a preferred embodiment of the invention has been described using specific terms, such description is illustrative purposes only, and it is to be understood that changes and variations may be made without departing from the spirit and scope of the invention as recited in the following claims.

What is claimed is:

1. An electronic component socket for connecting to an electrical circuit on a printed circuit board an electronic component having a package and at least one pair of rows of leads arranged along at least one pair of sides of said package, which comprises:

a socket body made from an insulating material so as to have a floor portion on which said electronic component is to be mounted and at least one pair of side walls extending upwardly from said floor portion;

a plurality of contact channels provided on said floor portion and arranged along said side walls at an arranging pitch equal to that of said leads;

a plurality of contact elements, each being made from conductive, resilient sheet metal and having a generally S-shaped form so as to give a spring property in a vertical direction, said contact element having at an upper end a contact portion for contact with a corresponding lead of said electronic component and a connection portion to be connected to a corresponding conductor of said electrical circuit, said contact element being disposed in a corresponding contact channel on said floor portion such that said contact portion is exposed from an upper surface of said floor portion adjacent said side wall and said connection portion is positioned on a lower surface of said floor portion;

movable retainer means with a pair of retaining sides extending downwardly for pressing each lead of said electronic component onto a corresponding contact portion of said contact element against a vertical spring force of said contact element;

at least one pair of rows of guiding posts provided on said floor portion, said post within each row being on opposite sides of each contact channel to form guiding grooves for said leads therebetween and spaced from said adjacent side wall to form an elongated recess for receiving said retaining sides;

first engaging means provided on an inside of said side wall; and second engaging means provided on an outside of said movable retainer means at a position corresponding to said first engaging means for engagement with said first engaging means by sliding said movable retainer means to one side so that said retaining means is slid sideways on upper surfaces of said leads, whereby said movable retainer means is latched to said socket body while contact surfaces of said leads and said contact portions are cleaned.

2. The electronic component socket of claim 1, wherein said movable retainer means is shaped in a generally rectangular frame form.

3. The electronic component socket of claim 1, wherein said movable retainer means consists of four movable retainer members.

4. An electronic component socket for connecting an electronic component with contact means to an electrical circuit on a printed circuit board, which comprises:

a socket body made from an insulating material so as to have a floor portion on which said electronic component is to be mounted and at least one pair of side walls extending upwardly from said floor portion;

a plurality of contact channels provided on said floor portion and arranged along said side walls at an arranging pitch equal to that of said leads;

a plurality of contact elements, each being made from conductive, resilient sheet metal and having a generally S-shaped form so as to give a spring property in a vertical direction, said contact element having at an upper end a contact portion for contact with a corresponding contact means of said electronic component and a connection portion to be connected to a corresponding conductor of said electrical circuit;

movable retainer means having a pair of downwardly extending retaining sides;

an L-shaped latch notch provided on an inside of said side wall, said latch notch having a horizontal leg with a flat top surface and a vertical leading surface; and a latch stud with a flat top surface and a vertical leading surface, said latch stud being provided on an outside of said movable retainer means at a position corresponding to said latch notch for engagement with said latch notch by first press downwardly against a spring force of said contact element and then sliding laterally said movable retainer means to one side so that said electronic component is slid slightly sideways, whereby not only said movable retainer means is latched to said socket body but also contact surfaces of said contact means and said contact portions are cleaned.

5. The electronic component socket of claim 4, wherein said movable retainer means is shaped in a generally rectangular frame form.

6. The electronic component socket of claim 4, wherein said movable retainer means consists of four movable retainer members.

7. The electronic component socket of claim 4 wherein said movable retainer means is shaped in a generally rectangular dish form such that its retaining ceiling presses a top surface of said electronic component.

* * * * *